(12) United States Patent
Flachowsky et al.

(10) Patent No.: US 8,524,566 B2
(45) Date of Patent: Sep. 3, 2013

(54) METHODS FOR THE FABRICATION OF INTEGRATED CIRCUITS INCLUDING BACK-ETCHING OF RAISED CONDUCTIVE STRUCTURES

(75) Inventors: Stefan Flachowsky, Dresden (DE); Ricardo P. Mikalo, Heidelblick (DE); Jan Hoentschel, Dresden (DE)

(73) Assignee: GlobalFoundries, Inc., Grand Cayman (KY)

(*) Notice: Subject to any disclaimer, the term of this patent is extended or adjusted under 35 U.S.C. 154(b) by 75 days.

(21) Appl. No.: 13/331,951

(22) Filed: Dec. 20, 2011

(65) Prior Publication Data

US 2013/0157421 A1  Jun. 20, 2013

(51) Int. Cl.
*H01L 21/336* (2006.01)

(52) U.S. Cl.
USPC .............. 438/300; 257/E21.43; 257/E21.619; 257/E21.634; 257/E27.108; 257/204; 438/199

(58) Field of Classification Search
USPC ............. 257/E21.43, E21.619, E21.634, 257/204, E27.108; 438/199, 300
See application file for complete search history.

(56) References Cited

U.S. PATENT DOCUMENTS

| | | | | |
|---|---|---|---|---|
| 2004/0132258 A1* | 7/2004 | Jin et al. | | 438/302 |
| 2008/0132011 A1* | 6/2008 | Lee et al. | | 438/191 |
| 2008/0217686 A1* | 9/2008 | Majumdar et al. | | 257/347 |

* cited by examiner

*Primary Examiner* — Asok K Sarkar
(74) *Attorney, Agent, or Firm* — Ingrassia Fisher & Lorenz, P.C.

(57) ABSTRACT

Embodiments of a method for fabricating an integrated circuit are provided. In one embodiment, the method includes producing a partially-completed semiconductor device including a substrate, source/drain (S/D) regions, a channel region between the S/D regions, and a gate stack over the channel region. At least one raised electrically-conductive structure is formed over at least one of the S/D regions and separated from the gate stack by a lateral gap. The raised electrically-conductive structure is then back-etched to increase the width of the lateral gap and reduce the parasitic fringing capacitance between the raised electrically-conductive structure and the gate stack during operation of the completed semiconductor device.

20 Claims, 6 Drawing Sheets

METHODS FOR THE FABRICATION OF INTEGRATED CIRCUITS INCLUDING BACK-ETCHING OF RAISED CONDUCTIVE STRUCTURES

TECHNICAL FIELD

The present invention relates generally to integrated circuits and, more particularly, to methods for the fabrication of integrated circuits wherein raised-conductive structures adjacent the transistor gates are back-etched to reduce parasitic fringing capacitances.

BACKGROUND

Although technically referring to a semiconductor device having a metal gate electrode and an oxide gate insulator, the term "MOS transistor" is now commonly utilized (and is utilized herein) to refer to any semiconductor device including a conductive gate electrode (whether metal or other conductive material) positioned over a gate insulator (whether oxide or other insulator), which is, in turn, positioned over a semiconductor substrate. The gain of a MOS transistor, usually defined by the transconductance ($g_m$), is proportional to the mobility ($\mu$) of the majority carrier in the transistor channel. The current carrying capacity, and hence the performance of a MOS transistor, is proportional to the mobility of the majority carrier in the channel. The mobility of holes, the majority carrier in a P-channel MOS (PMOS) transistor, can be enhanced by embedding a compressive strain material, such as silicon germanium (SiGe), in the source/drain (S/D) regions of the semiconductor substrate adjacent the opposing channel ends. Conversely, the mobility of electrons, the majority carrier in an N-channel MOS (NMOS) transistor, can be increased by embedding a tensile strain material, such as carbon-doped silicon (SiC), in the S/D regions and adjacent the channel ends. Conventionally-known stress engineering methods are capable of greatly enhancing transistor performance by improving drive current and switching speed without increasing device size and capacitance.

Embedding of strain material within a transistor's S/D regions is often accomplished by first etching cavities in the S/D regions and epitaxially growing a chosen strain material within the cavities. In certain cases, the epitaxial growth process may be continued well-beyond the point at which the cavities are filled with strain material to form a column of strain material projecting upward from the substrate's upper surface (referred to herein as the "strain material overgrowth region"). In the case of epitaxially-grown SiGe embedded within the S/D regions of a PMOS transistor, it may be desirable to produce such a strain material overgrowth region for several reasons, including: (i) to impart greater stress to the PMOS channel region by increasing the overall volume of the epitaxially-grown SiGe; (ii) to provide excess strain material to be consumed during slicidation; and/or (iii) to offset tensile stress applied to the PMOS channel region by a tensile stress liner, which may be blanket deposited over both the PMOS and NMOS transistors to enhance the performance of the NMOS transistors.

While providing the above-described benefits, the formation of strain material overgrowth regions (or other electrically-conductive raised structures) adjacent the transistor gates results in at least one significant disadvantage. Due to the relatively narrow lateral gap separating each strain material overgrowth region and the sidewall of the neighboring gate, which is filled with a dielectric material during the circuit fabrication process, relatively high parasitic fringing capacitances are typically created between the gate and the neighboring overgrowth regions. As the transistors switch states, each of these parasitic fringing capacitances requires charging and discharging. Thus, when considered collectively, the parasitic fringing capacities can greatly reduce the overall operational speed and performance of the completed integrated circuit.

Considering the above, it is desirable to provide embodiments of an integrated circuit fabrication process wherein strain material overgrowth regions are formed over the transistor source/drain regions to provide the above-noted benefits, while parasitic fringing capacitances are reduced in the finished circuit to enhance performance. More generally, it is desirable to provide embodiments of an integrated circuit fabrication process wherein parasitic fringing capacitances between the transistor gates and neighboring raised electrically-conductive structures, such as strain material overgrowth regions or raised source/drain regions, are significantly reduced. Other desirable features and characteristics of the present invention will become apparent from the subsequent detailed description and the appended Claims, taken in conjunction with the accompanying Drawings and the foregoing Technical Field and Background.

BRIEF SUMMARY

Embodiments of a method for fabricating an integrated circuit are provided. In one embodiment, the method includes producing a partially-completed semiconductor device including a substrate, source/drain (S/D) regions, a channel region between the S/D regions, and a gate stack over the channel region. At least one raised electrically-conductive structure is formed over at least one of the S/D regions and separated from the gate stack by a lateral gap. The raised electrically-conductive structure is then back-etched to increase the width of the lateral gap and reduce the parasitic fringing capacitance between the raised electrically-conductive structure and the gate stack during operation of the completed semiconductor device.

BRIEF DESCRIPTION OF THE DRAWINGS

The present invention will hereinafter be described in conjunction with the following drawing figures, wherein like numerals denote like elements, and wherein.

DETAILED DESCRIPTION

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description.

Figure 1:
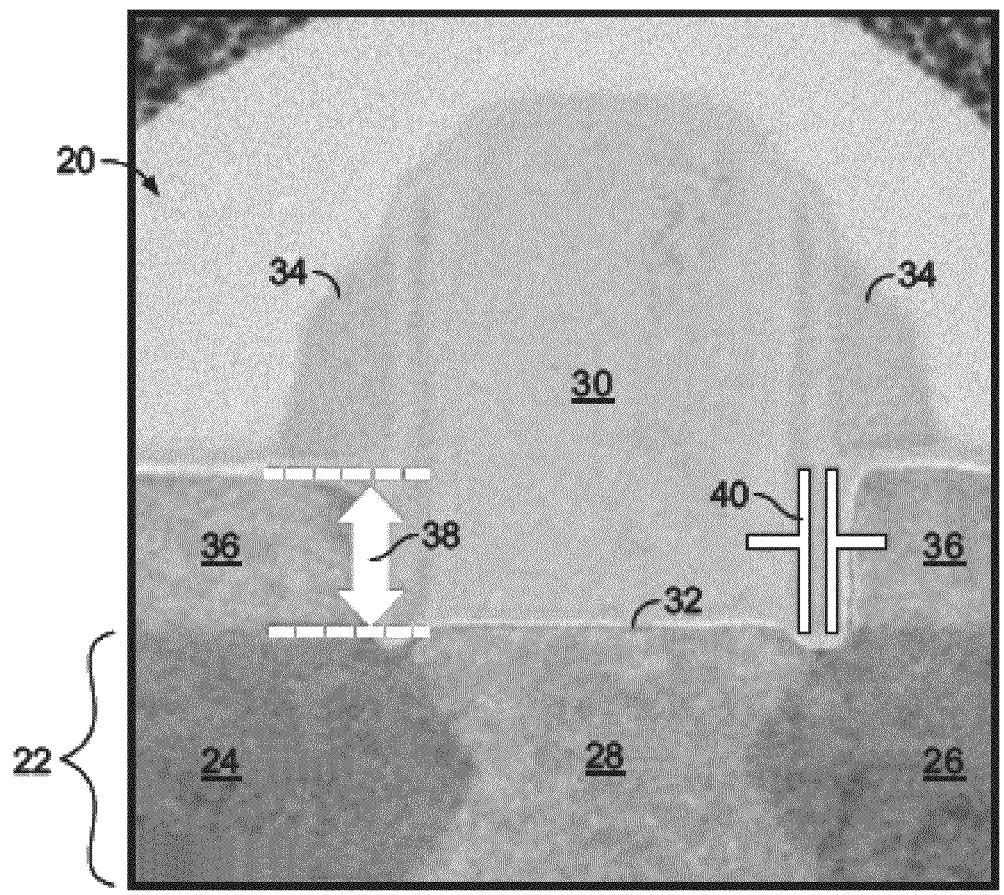
FIG. 1 is a transmission electron microscope (TEM) image of a semiconductor device including strain material overgrowth regions and illustrated in accordance with the teachings of prior art.

FIG. 1 is a transmission electron microscope (TEM) image of a PMOS transistor 20 illustrated in accordance with the teachings of prior art. PMOS transistor 20 includes a semiconductor substrate 22; S/D regions 24, 26 within substrate 22; and a channel region 28 extending between S/D regions 24, 26. A gate 30 is formed over channel region 28 and electrically isolated therefrom by an intervening dielectric layer 32. Sidewall spacers 34 are formed laterally adjacent opposing sides of gate 30. As indicated in FIG. 1 by the shape of the interface between channel 28 and S/D regions 24, 26, a strain material has been embedded into S/D regions 24, 26. In the illustrated example wherein transistor 20 is a PMOS transistor, a compressive strain material, such as SiGe, is embedded into S/D regions 24, 26. To provide the various benefits described in the foregoing section entitled "BACKGROUND," strain material overgrowth regions 36 are grown over the main bodies of strain material embedded within S/D regions 24, 26. As indicated in FIG. 1 by double-headed arrow 38, each strain material overgrowth region 36 is grown to a predetermined height, which may be between 20 to 40 nanometers (nm), as measured from the interface between gate 30 and gate insulator 32. Strain material overgrowth regions 36 are separated from the opposing sidewalls of gate 30 by relatively narrow gaps, which are filled with a dielectric material during semiconductor fabrication. As a result, a parasitic fringing capacitance is created between gate 30 and each strain material overgrowth region 36 (represented in FIG. 1 by capacitor symbol 40). Such parasitic fringing capacitances can significantly delay the switching speed of PMOS transistor 20 and are consequently undesirable.

The following describes exemplary embodiments of an integrated circuit fabrication method wherein strain material overgrowth regions are formed over one or more transistors' source/drain regions, while parasitic fringing capacitances between the overgrowth regions and the transistor gates are reduced. By way of non-limiting illustration, the exemplary embodiment of the integrated circuit fabrication process is described below in conjunction with a particular type of transistor, namely, a P-type or PMOS transistor. It will be readily appreciated, however, that embodiments of the integrated circuit fabrication process can also be utilized to produce NMOS transistors individually or alongside the PMOS transistors with appropriate changes in dopant types and strain materials. Embodiments of the below-described integrated circuit fabrication method can also be advantageously employed to reduce parasitic fringing capacitances in semiconductor devices fabricated on ultra-thin silicon-on-insulator substrates and having raised source/drain regions, as described below in conjunction with FIGS. 9 and 10. Various steps in the manufacture of MOS transistors are well-known and, in the interests of concision, will only be mentioned briefly herein or will be omitted entirely without providing the well-known process details.

FIGS. 2-7 are simplified cross-sectional views of an exemplary integrated circuit 50 at various stages of completion and illustrated in accordance with an exemplary embodiment of the present invention. Only a small portion of integrated circuit 50, which includes two electrically-coupled PMOS transistors 52, is shown in FIGS. 2-7 for clarity; however, it will be appreciated that numerous other PMOS and NMOS transistors will typically be included within the integrated circuit and simultaneously produced alongside the illustrated PMOS transistors during the below-described fabrication method.

Figure 2:
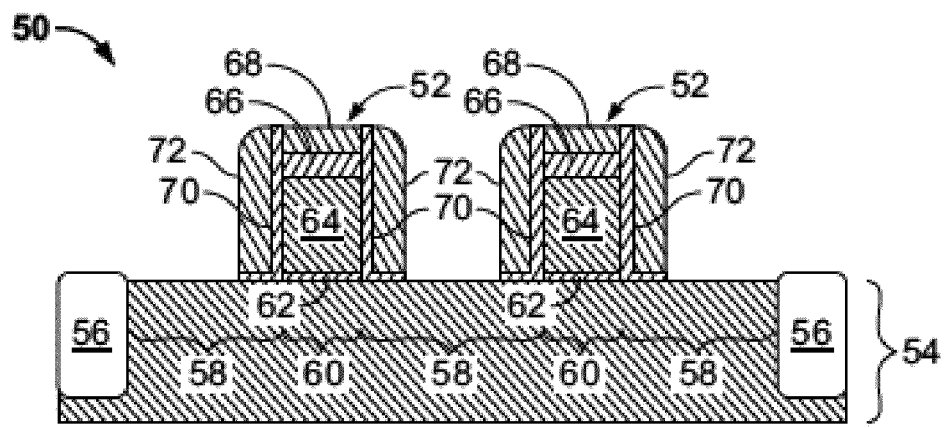
FIGS. 2-7 are simplified cross-sectional views of an exemplary integrated circuit including strain material overgrowth regions, shown at various stages of completion, and illustrated in accordance with an exemplary embodiment of the present invention.

Referring initially to FIG. 2, PMOS transistors 52 are produced on a semiconductor substrate 54. Semiconductor substrate 54 can be a bulk silicon wafer or any other substrate on or in which transistors 52 can be fabricated including, but not limited to, other type IV semiconductor materials, as well as type III-V and II-VI semiconductor materials, organic semiconductors, and combinations thereof, whether in bulk single crystal, polycrystalline form, thin film form, semiconductor-on-insulator form, or combinations thereof. Furthermore, as appearing herein, "silicon layer," "silicon substrate," and similar terms and phrases encompass bodies composed of the relatively pure silicon materials typically utilized in the semiconductor industry, as well as silicon admixed with other elements, such as germanium, carbon, indium, and the like.

Electrical isolation features 56 are formed within semiconductor substrate 54 to electrically isolate PMOS transistors 52 from one or more neighboring transistors (not shown). In the illustrated exemplary embodiment, a shallow trench isolation (STI) formation technique is utilized to form STI features 56 within substrate 54. STI features 56 may be formed by, for example, initially etching a shallow trench into substrate 54, growing a thermal oxide liner within the etched trench, and subsequently filling the trench by depositing an oxide into the trench and over the thermal oxide liner. After the formation of STI features 56, well regions may be implanted into semiconductor substrate 54 and within the boundaries of STI features 56; e.g., in the illustrated example wherein PMOS transistors 52 are fabricated, an n-type well region can be formed within the illustrated portion of semiconductor substrate 54 via the implantation of arsenic or phosphorus ions. Conversely, in the case of NMOS transistors, p-type well regions can be formed within substrate 54 via the impanation of boron ions. At this juncture or later in the fabrication process, source/drain (S/D) regions 58 are formed within semiconductor substrate 54 by, for example, ion implantation thereby defining channel regions 60 extending between S/D regions 58.

Partially-completed PMOS transistors 52 each include a gate insulator 62 formed over a transistor channel regions 60, an electrically-conductive gate 64 formed over gate insulator 62, an oxide cap 66 formed over gate 64, and a nitride cap 68 formed over oxide cap 66. Gate insulator 62 can be a layer of thermally grown silicon dioxide, a layer of deposited oxide, a layer of material having a high dielectric constant as compared to silicon dioxide (e.g., a high k material), or a layered combination of dielectric materials (e.g., an oxide and high k material). Gate 64 can be a layer of polycrystalline silicon, a metal, a conductive work function-determining material, or a combination of these materials. Gate insulator 62 and gate 64 are collectively referred to herein as "gate stack 62, 64." An oxide liner 70 is deposited over partially-fabricated PMOS transistors 52 and the upper surface of substrate 54, and relatively thin sidewall spacers 72 (commonly referred to as "zero spacers") are formed adjacent the opposing sidewalls of each gate stack 62, 64 by, for example, the deposition and etching of silicon nitride or other spacer-forming material. An etch is then performed to remove the exposed portions of oxide liner 70 and yield the structure shown in FIG. 2. Following this etch, one or more ion implantations may then be performed utilizing sidewall spacers 72 as an implant mask to create halo regions and/or extension regions (not shown) within semiconductor substrate 54, which may then be activated utilizing a laser activation anneal.

Figure 3:
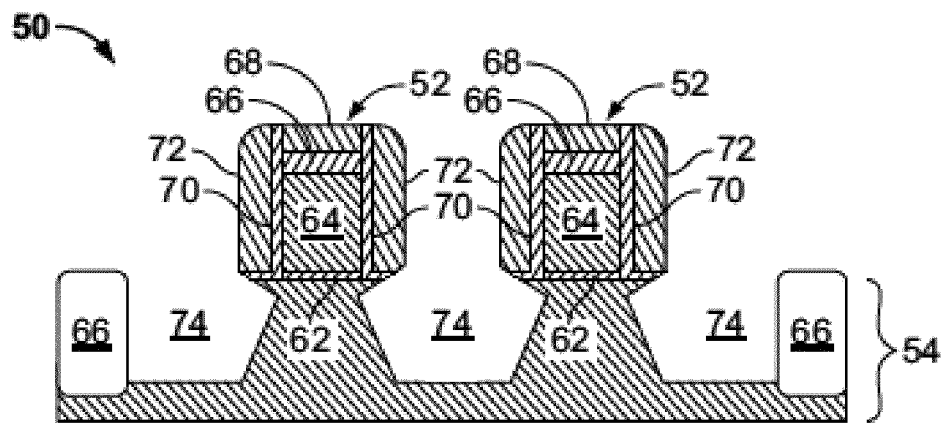

With reference to FIG. 3, cavities 74 are next etched into S/D regions 58 of PMOS transistors 52. In one possible implementation of the fabrication method, cavities 74 are formed by first depositing a nitride hardmask over any NMOS transistors included within partially-completed integrated circuit 50 (not shown), and forming secondary spacers (commonly referred to as "epitaxial spacers") are then formed adjacent zero spacers 72 to provide a desired standoff from the channel center and thereby reduce undercutting of the gate stacks. Cavities 74 are then etched into semiconductor substrate 22 utilizing an isotropic or anisotropic etchant having a silicon-selective chemistry. A crystallographically-selective etchant (i.e., an etchant that removes different crystallographic planes at different etch rates) is advantageously employed to impart each cavity 74 with a generally pentagonal cross-sectional geometry, as generally shown in FIG. 3. Suitable crystallographically-selective etchants include potassium hydroxide (KOH), tetramethylammonium hydroxide (TMAH), and ethylenediamine pyrocatechol (EDP). The nitride hard mask, the epitaxial spacers, and nitride cap 68 (shown in FIG. 2) may then be removed utilizing one or more etching processes (e.g., a hot phosphorous acid wet etch) to yield the structure shown in FIG. 3.

Figure 4:
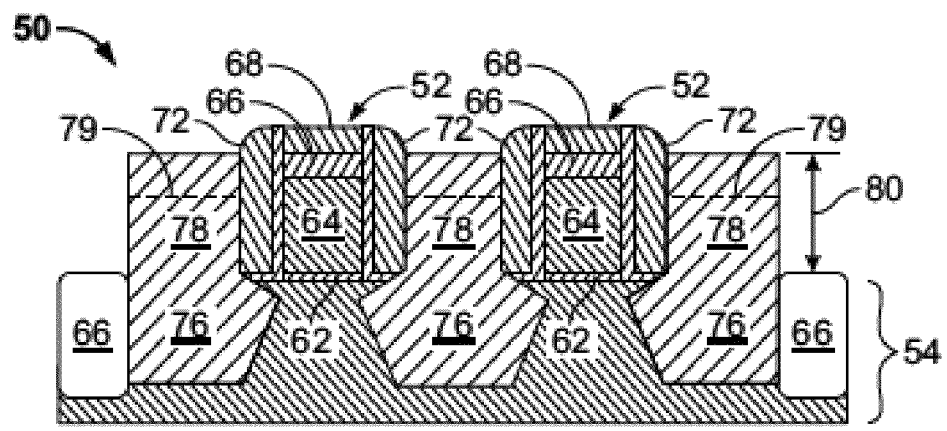

A selective epitaxial growth (SEG) process is utilized to grow a chosen strain material on the exposed areas of semiconductor substrate 54. As oxide cap 66 and sidewall spacers 72 effectively encapsulate gate 64, epitaxial growth will not occur on gate 64 in embodiments wherein gate 64 is composed of or includes a layer of polycrystalline silicon. As a result, epitaxial growth of the strain material will generally be confined to interior surfaces of cavities 74. Each cavity 74 (FIG. 3) will typically be filled with the epitaxially-grown strain material during the SEG process to produce a main body or base of strain material embedded within S/D regions 58 of substrate 54 (referred to herein as "embedded strain material region 76"). In addition, the SEG process parameters are controlled such that epitaxial growth of the strain material continues beyond the point at which cavities 74 are filled with strain material to further produce strain material overgrowth regions 78 projecting upward from the embedded strain material regions 76. As generally shown in FIG. 4, strain material overgrowth regions 78 extends upwardly from the upper surface of semiconductor substrate 54 directly adjacent sidewall spacers 72. In the illustrated example wherein transistors 52 are PMOS transistors, a compressive strain material is grown within cavities 74 (FIG. 3) to apply a compressive longitudinal stress to, and thus increase hole mobility within, the transistor channel region. Suitable compressive strain materials include embedded epitaxial silicon germanium (eSiGe) and embedded epitaxial silicon indium (eSiIn). Conversely, in embodiments wherein the semiconductor device or devices are NMOS transistors, a tensile strain material (e.g., epitaxially-grown silicon-carbon) is embedded into substrate 54 adjacent the channel ends to increase electron mobility in the transistor channel.

Although the heights to which strain material overgrowth regions 78 are grown will inevitably vary amongst embodiments, the SEG process parameters are conveniently controlled to impart each strain material overgrowth region 78 with an increased height relative to comparable strain material overgrowth region grown utilizing a conventional SEG process, the typical height of which is represented in FIG. 4 by dashed line 79. In this regard, the SEG process may be carried-out for moderately longer durations and/or at moderately higher temperatures to increase the height of overgrowth regions 78 by about 5 to about 10 nm as compared to a conventionally-grown overgrowth region to compensate for material loss occurring during the back-etching process described below in conjunction with FIG. 5. As represented in FIG. 4 by double-headed arrow 80, the final height of each strain material overgrowth region 78 may be between about 25 to about 50 nm, as measured from the interface of gate insulator 62 and gate 64. The widths of strain material overgrowth regions 78 are generally determined by the lateral spacing between sidewall spacers 72 and are consequently unaffected by such modest adjustments in the SEG process. In one specific implementation wherein the SEG process is carried-out to grown eSiGe within S/D cavities 74 (FIG. 3), partially-fabricated integrated circuit 50 is heated to a temperature between about 650 and about 750 degrees Celsius for a duration between about 5 and about 12 minutes in the presence of a germanium source, such as $GeH_4$.

Figure 5:
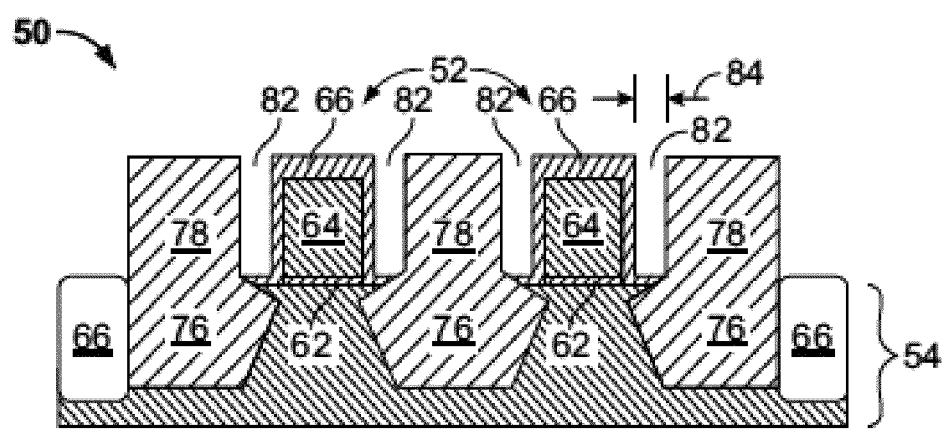

An etching process is next performed to remove nitride cap 68, sidewall spacers 72, and the uppermost portions of oxide liner 70 adjacent nitride cap 68 (identified in FIGS. 2 and 3). In embodiments wherein sidewall spacers 72 are each composed of silicon nitride, sidewall spacers 72 and nitride cap 68 are conveniently removed utilizing a hot phosphorous acid wet etch. FIG. 5 illustrates partially-fabricated integrated circuit 50 after removal of nitride cap 68, sidewall spacers 72, and the upper portions of oxide liner 70. No longer supported by sidewall spacers 72, strain material overgrowth regions 78 are now freestanding. Each freestanding overgrowth region 78 is laterally offset or spaced apart from the sidewall of the neighboring gate 64 by relatively narrow void or air gap 82. At this juncture in the fabrication process, lateral gaps 82 each have a relatively narrow width (identified in FIG. 5 by convergent arrows 84), which may be, for example, about 10 nm.

Figure 6:
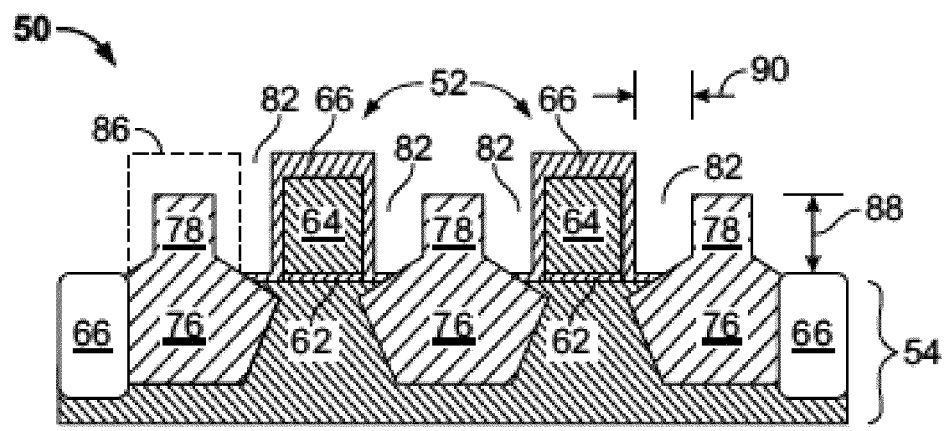

After removal of nitride cap 68 and sidewall spacers 72, a back-etching process is performed to narrow freestanding overgrowth regions 78 and thereby increase the widths of the lateral gaps 82 separating each gate 64 from its neighboring overgrowth regions 78. FIG. 6 illustrates integrated circuit 50 after back-etching of freestanding overgrowth regions 78. Back-etching can be accomplished by contacting freestanding overgrowth regions 78 with an isotropic etchant selective to the material from which overgrowth regions 78 are formed; e.g., in the exemplary embodiment wherein overgrowth regions 78 are composed of SiGe, back-etching may be performed utilizing a wet chemical etchant and, specifically, a etchant that is selective to Si/SiGe over oxide cap 66 and oxide liner 70 (identified in FIGS. 2 and 3), such as hydrochloric acid (HCl). As an isotropic etchant is employed, material is removed from all exposed surfaces of overgrowth regions 78; thus, both the height and width of each overgrowth region 78 is reduced during the back-etching process. This may be more fully appreciated by referring to dashed lines 86 in FIG. 6, which represent the original dimensions of one freestanding overgrowth region 78 prior to back-etching.

The amount of material removed from the height and width of overgrowth regions will vary amongst embodiments; however, by way of non-limiting example, about 5 to about 10 nm of material may be removed from each side of overgrowth regions 78, such that the height of each overgrowth region 78 is decreased by about 5 to about 10 nm, while width of each overgrowth region 78 is narrowed by about 10 to about 20 nm. Freestanding overgrowth regions 78 may be back-etched to a predetermined height (identified in FIG. 6 by double headed arrow 88) of, for example, about 20 to about 40 nm. Notably, the final height of freestanding overgrowth regions 78 may be substantially equivalent to the overgrowth fill level/height of the strain material overgrowth regions produced pursuant to a conventional SEG process of the type described above. The back-etching process is conveniently performed to impart each lateral gap 82 with a final width of about 15 to about 30 nm or, more specifically, a final width of about 20 nm (identified in FIG. 6 by convergent arrows 90). The final width of each overgrowth region 78 will vary amongst embodiments, but is conveniently at least about 40 nm to ensure sufficient upper surface area for reliable silicidation and contact formation, as described more fully below in conjunction with FIG. 7. In one implementation, the final width of each overgrowth region 78 is 40 nm±10 nm.

Figure 7:
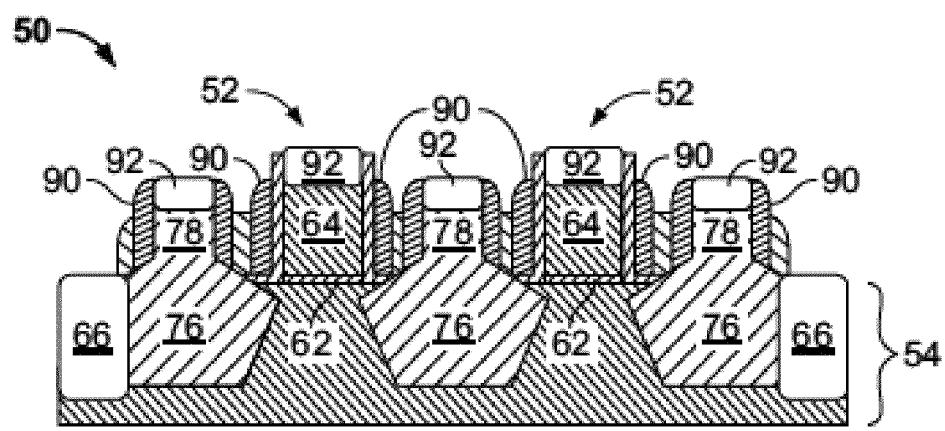

FIG. 7 illustrates integrated circuit 50 after further processing. For example, at the state of manufacture shown in FIG. 7, one or more oxide liners (not shown) may have been deposited over circuit 50, one or more sets of permanent sidewall spacers 90 may be formed adjacent gates 64 and overgrowth regions 78; halo and extension regions may have been implanted into the channel regions of any NMOS transistors included within integrated circuit 50 (also not shown); and one or more source/drain implants may have been performed and activated utilizing, for example, a rapid thermal anneal. In the illustrated example, a silicide-forming material (e.g., nickel) is deposited (e.g., via a sputtering process) over the upper surface of integrated circuit 50 and heated to a predetermined temperature to convert the uppermost portions of back-etched overgrowth regions 78 and gates 64 to silicide (indicated in FIG. 7 at 92). Although not illustrated, an interlayer dielectric may next be deposited over PMOS transistors 52 and conductive plugs formed in ohmic contact with silicide regions 92. Further conventionally-known processing steps, such as device interconnection during back end-of-the-line processing, can then be performed to complete the manufacture of integrated circuit 50.

Figure 8:
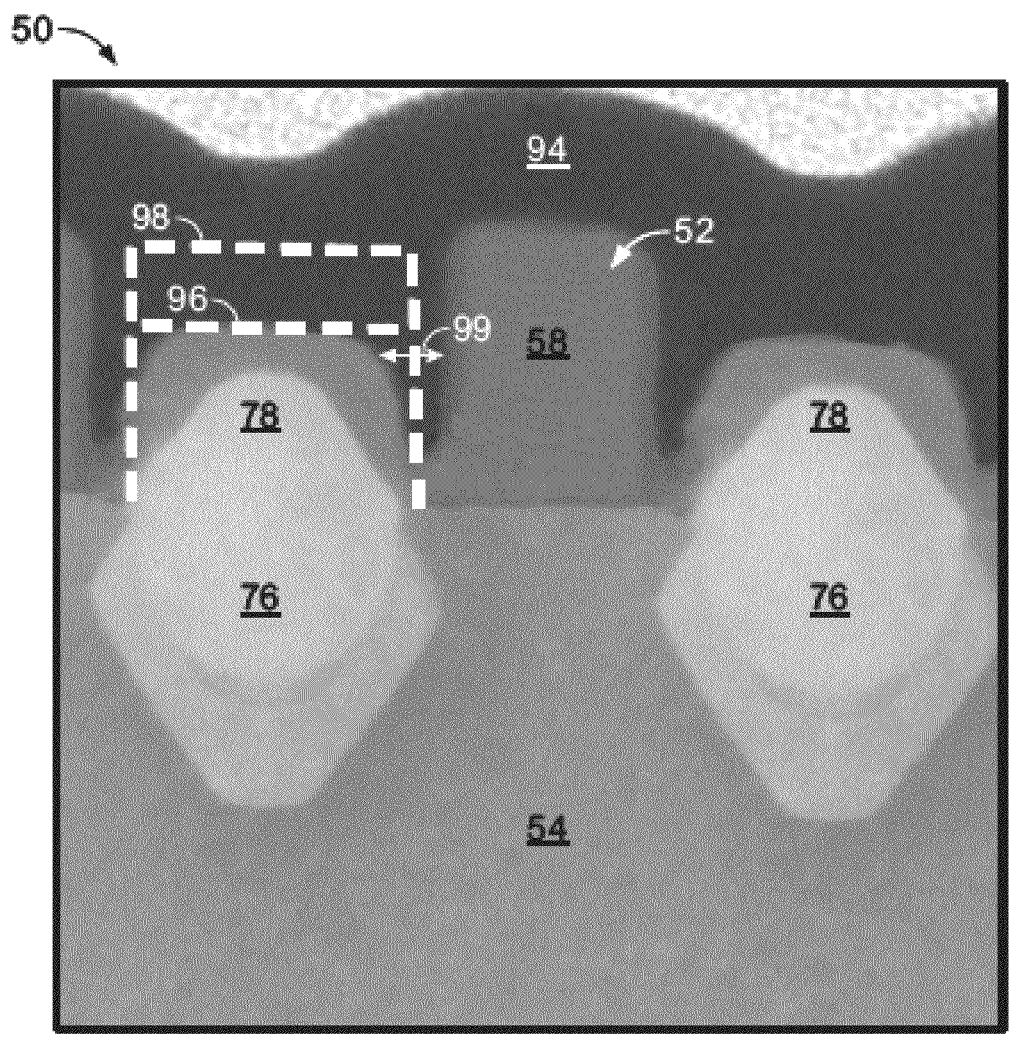
FIG. 8 is a TEM image of a semiconductor device included within the integrated circuit shown in FIGS. 2-7 and produced in accordance with an exemplary embodiment of the present invention.

FIG. 8 is a TEM image of PMOS transistors 52 (certain features not shown) after back-etching of strain material overgrowth regions 78 and the subsequent deposition of a dielectric material 94. For reference, the outline of a conventionally-formed overgrowth region is depicted in FIG. 8 by dashed lines 96, while the height of the illustrated strain material overgrowth region 78 prior to back-etching is represented by dashed lines 98. As can be seen, the final height of strain material overgrowth region 78 is substantially equivalent to the height of the conventionally-formed overgrowth region (again represented in FIG. 8 by dashed lines 96). However, the width of the lateral gap separating strain material overgrowth region 78 from the neighboring sidewall of gate 64 has been increased (indicated in FIG. 8 by double-headed arrow 99). As a result, the parasitic fringing capacitance created between strain material overgrowth region 78 and gate 64 (and the various other overgrowth regions and transistor gates included within integrated circuit 50) are significantly reduced, and the overall performance of integrated circuit 50 is enhanced.

Figure 9:
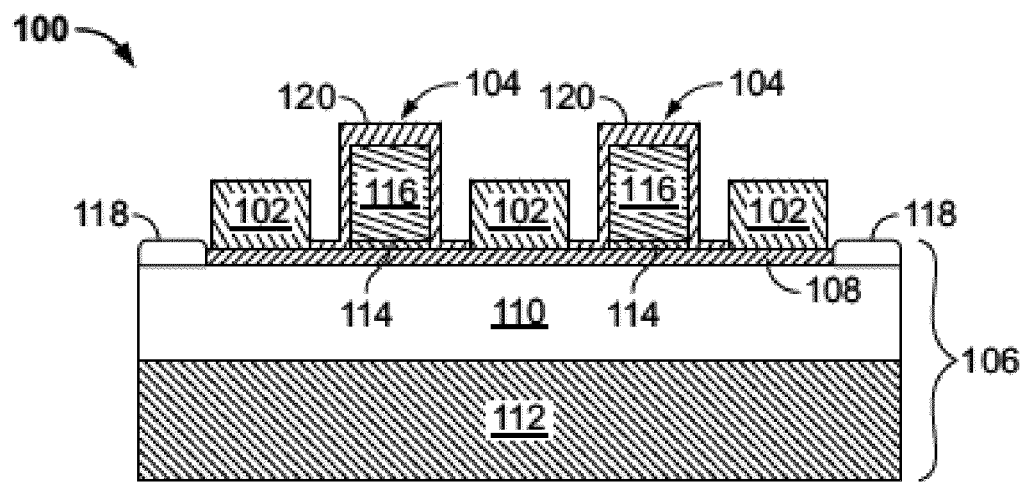
FIGS. 9 and 10 are simplified cross-sectional views of an exemplary integrated circuit including raised source/drain regions, shown at two different stages of completion, and illustrated in accordance with a further exemplary embodiment of the present invention.
Figure 10:
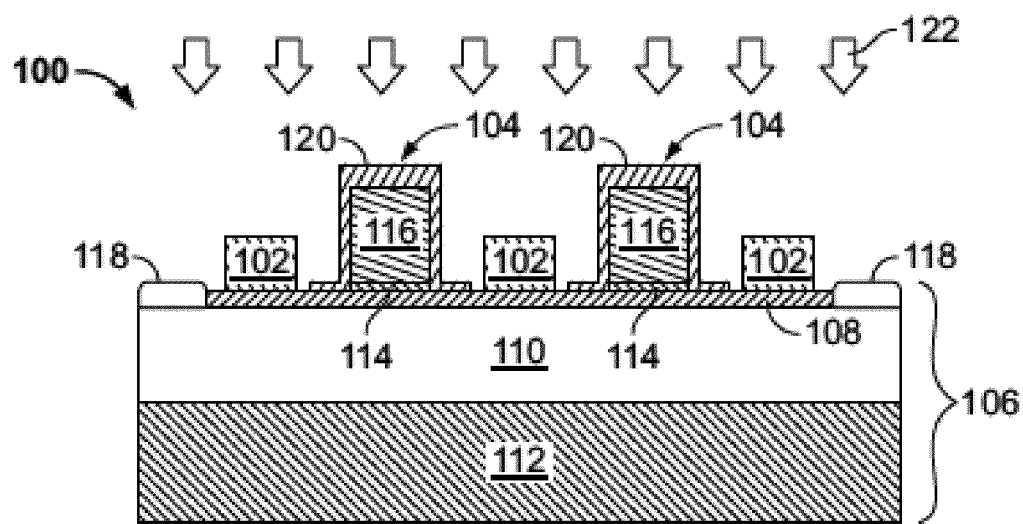

The foregoing has thus described an exemplary embodiment of an integrated circuit fabrication method wherein strain material overgrowth regions formed over the transistor source/drain regions are back-etched to reduce parasitic fringing capacitances in the finished circuit. As previously stated, embodiments of the integrated circuit fabrication method are also advantageously employed in the fabrication of semiconductor devices produced on ultra-thin silicon-on-insulator substrates and having raised source/drain regions. To further emphasize this point, FIGS. 9 and 10 are simplified cross-sectional views of an exemplary integrated circuit 100 shown prior to and subsequent to back-etching, respectively, of raised source/drain regions 102, as illustrated in accordance with a further exemplary embodiment of the present invention. As was the case previously, only a small portion of integrated circuit 100 is shown in FIGS. 9 and 10, which includes two electrically-coupled transistors 104. Transistors 104 are fabricated on a silicon-on-insulator ("SOI") wafer 106 including an upper silicon layer 108 overlaying an intermediate insulating layer 110 (also commonly referred to as a "buried oxide" or "BOX" layer), which is supported by a silicon carrier wafer 112. In one embodiment, SOI wafer 106 assumes the form of a ultra-thin body ("UTB") SOI substrate; i.e., an SOI substrate wherein the thickness of overlaying silicon layer 108 is less than approximately 25 nm.

Transistors 104 each include a gate insulator 114, which is formed over upper silicon layer 108, and a gate 116, which is formed over gate insulator 114. Gate insulators 114 and gates 116 can be fabricated from the same or similar materials from which gate insulators 62 and gates 64 are fabricated, as described above in conjunction with FIG. 2. STI features 118 have been formed within overlaying silicon layer 108 to electrically isolate transistors 104 from neighboring semiconductor devices (not shown for clarity). Raised S/D regions 102 are grown over upper silicon layer 108 and proximate the ends of the transistor channels utilizing a conventional selective epitaxial growth process. An oxide liner 120 may then be formed over transistors 104 utilizing a deposition process (e.g., chemical vapor deposition) and etched to yield the structure shown in FIG. 9.

At the juncture of the fabrication process shown in FIG. 9, raised S/D regions 102 are separated or laterally offset from gates 116 by relatively narrow gaps, which are later filled with a dielectric material and which can create parasitic fringing capacitances during operation of integrated circuit 100. Thus, to reduce any such parasitic fringing capacitances and improve the switching speeds of the finished transistors, raised S/D regions 102 are subjected to a back-etching process to increase the widths of the lateral gaps separating S/D regions 102 from gates 116, as represented in FIG. 10 by arrows 122. Back-etching can be carried-out utilizing an isotropic etchant having a silicon-selective chemistry; e.g., as noted above, a $HNO_3$ and/or HF wet etch can be utilized. As such a wet etching process is isotropic, both the height and the width of each raised S/D region 102 will be reduced. If desired, raised S/D regions 102 may be imparted with greater heights during the above-described SEG process to compensate for this decrease in height during the back-etching process. In one embodiment, about 5 to about 10 nm of material may be removed from each side of raised S/D regions 102 during the back-etching process to impart the lateral gaps separating raised S/D regions 102 and gates 116 with a final width of, for example, about 15 to about 30 nm.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention, as set forth in the appended Claims and the legal equivalents thereof.

What is claimed is:

1. A method for fabricating an integrated circuit, comprising:
    producing a partially-completed semiconductor device including a substrate, source/drain (S/D) regions, a channel region between the S/D regions, and a gate stack over the channel region;
    forming at least one raised electrically-conductive structure over at least one of the S/D regions and separated from the gate stack by a lateral gap; and
    back-etching the raised electrically-conductive structure to increase the width of the lateral gap and reduce the parasitic fringing capacitance between the raised electrically-conductive structure and the gate stack during operation of the completed semiconductor device.

2. A method according to claim 1 wherein producing comprises producing the partially-completed semiconductor device to further include sidewall spacers adjacent the gate stack, and wherein forming comprises forming at least one raised electrically-conductive structure adjacent at least one of the sidewall spacers.

3. A method according to claim 2 further comprising removing the sidewall spacers to produce the lateral gap separating the raised electrically-conductive structure and the gate stack.

4. A method according to claim 1 wherein back-etching comprises exposing the raised electrically-conductive structure to an isotropic etchant for a predetermined time period to remove a predetermined amount of material from the raised electrically-conductive structure.

5. A method according to claim 1 wherein back-etching comprises back-etching the raised electrically-conductive structure under controlled process conditions to impart the lateral gap with a final width between about 15 and about 30 nanometers.

6. A method according to claim 5 wherein back-etching comprises back-etching the raised electrically-conductive structure under controlled process conditions to impart the lateral gap with a final width of about 20 nanometers.

7. A method according to claim 1 further comprising forming an electrically-conductive plug in ohmic contact with the raised-conductive structure after back-etching the raised-conductive structure.

8. A method according to claim 7 wherein back-etching comprises back-etching the raised electrically-conductive structure under controlled process conditions to impart the upper surface of the raised electrically-conductive structure with a width greater than about 40 nanometers.

9. A method according to claim 1 wherein forming comprises epitaxially growing the raised electrically-conductive structure on the semiconductor substrate and over the S/D regions.

10. A method according to claim 9 wherein epitaxially growing comprises epitaxially growing the electrically-conductive structure on the semiconductor substrate from a strain material.

11. A method according to claim 10 wherein epitaxially growing comprises epitaxially growing the electrically-conductive structure on the semiconductor substrate from a strain material and to a predetermined height between about 25 and about 50 nanometers.

12. A method according to claim 11 wherein back-etching comprises back-etching the raised electrically-conductive structure under control process conditions to remove about 5 to 10 nanometers from the height of the raised electrically-conductive structure.

13. A method according to claim 10 wherein epitaxially growing comprises:
    etching at least one cavity within at least one of the S/D regions; and
    epitaxially growing a strain material within the cavity to form a body of strain material having a lower portion embedded within the semiconductor substrate and having an upper portion extending from the lower portion to define the raised electrically-conductive structure.

14. A method according to claim 10 wherein producing comprises producing a partially-completed P-type semiconductor device, and wherein epitaxially growing comprises epitaxially growing the electrically-conductive structure on the semiconductor substrate from a compressive strain material.

15. A method according to claim 14 wherein epitaxially growing comprises epitaxially growing the electrically-conductive structure on the semiconductor substrate from silicon-germanium.

16. A method according to claim 10 wherein producing comprises producing a partially-completed N-type semiconductor device, and wherein epitaxially growing comprises epitaxially growing the electrically-conductive structure on the semiconductor substrate from a tensile strain material.

17. A method according to claim 1 wherein producing comprises producing the partially-completed semiconductor device on an ultra-thin silicon-on-insulator (SOI) substrate, wherein forming comprises epitaxially growing raised S/D regions on the ultra-thin SOI substrate separated from the gate stack by lateral gap, and wherein back-etching comprises back-etching the raised S/D regions to increase the widths of the lateral gaps to reduce the parasitic fringing capacitance between the raised S/D regions and the gate stack during operation of the semiconductor device.

18. A method for fabricating an integrated circuit, comprising:
    producing a partially-completed semiconductor device including a substrate, source/drain (S/D) regions, a channel region between the S/D regions, a gate stack over the channel region, and sidewall spacers adjacent opposing sides of the gate stack;
    etching cavities into the S/D regions;
    epitaxially growing bodies of strain material over the substrate, each body of strain material having an embedded region substantially filling the cavity and a freestanding overgrowth region adjacent the sidewall spacers;
    removing the sidewall spacers to create lateral gaps between the gate stack and the freestanding overgrowth regions; and
    back-etching each freestanding overgrowth regions to increase the widths of the lateral gaps such that any parasitic fringing capacitances created between the freestanding strain material overgrowth regions and the gate stack during operation of the completed semiconductor device are reduced.

19. A method according to claim 18 wherein epitaxially growing comprises epitaxially growing the bodies of strain material under controlled process conditions to impart each freestanding overgrowth regions with a predetermined height between about 25 and about 50 nanometers, and wherein back-etching comprises back-etching each freestanding overgrowth region to remove about 5 to about 10 nanometers from the height thereof.

20. A method for fabricating an integrated circuit, comprising:
    producing a partially-completed semiconductor device including an ultra-thin silicon-on-insulator (SOI) substrate, source/drain (S/D) regions, a channel region between the S/D regions, a gate stack over the channel region, and sidewall spacers adjacent opposing sides of the gate stack;
    epitaxially growing raised source/drain regions over the S/D regions of the ultra-thin SOI substrate adjacent the sidewall spacers;
    removing the sidewall spacers to create a lateral gap between the gate stack and each raised S/D region; and
    back-etching each raised S/D regions to increase the width of the lateral gaps such that any parasitic fringing capacitances created between the raised S/D regions and the gate stack during operation of the completed semiconductor device are reduced.

* * * * *